(12) United States Patent
Jezewski et al.

(10) Patent No.: US 9,379,010 B2
(45) Date of Patent: Jun. 28, 2016

(54) METHODS FOR FORMING INTERCONNECT LAYERS HAVING TIGHT PITCH INTERCONNECT STRUCTURES

(71) Applicant: Intel Corporation, Santa Clara, CA (US)

(72) Inventors: Christopher J. Jezewski, Hillsboro, OR (US); Jasmeet S. Chawla, Hillsboro, OR (US); Kanwal Jit Singh, Hillsboro, OR (US); Alan M. Myers, Beaverton, OR (US); Elliot N. Tan, Portland, OR (US); Richard E. Schenker, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/163,323

(22) Filed: Jan. 24, 2014

(65) Prior Publication Data

US 2015/0214094 A1 Jul. 30, 2015

(51) Int. Cl.
*H01L 21/768* (2006.01)
*H01L 23/532* (2006.01)

(52) U.S. Cl.
CPC ...... *H01L 21/7688* (2013.01); *H01L 21/76831* (2013.01); *H01L 21/76886* (2013.01); *H01L 23/5329* (2013.01)

(58) Field of Classification Search
CPC .................................................. H01L 23/5329
See application file for complete search history.

(56) References Cited

U.S. PATENT DOCUMENTS

| | | | |
|---|---|---|---|
| 2001/0038114 A1* | 11/2001 | IIjima et al. | 257/303 |
| 2006/0046407 A1* | 3/2006 | Juengling | H01L 27/10823 438/301 |
| 2007/0111431 A1* | 5/2007 | Engelhardt et al. | 438/253 |
| 2007/0261016 A1* | 11/2007 | Sandhu et al. | 716/19 |
| 2007/0281219 A1* | 12/2007 | Sandhu | 430/5 |
| 2009/0140234 A1* | 6/2009 | Moniwa et al. | 257/4 |
| 2010/0025858 A1* | 2/2010 | Weiss et al. | 257/774 |
| 2010/0075503 A1 | 3/2010 | Bencher et al. | |

(Continued)

FOREIGN PATENT DOCUMENTS

WO 2015/112272 A1 7/2015

OTHER PUBLICATIONS

International Search Report and Written Opinion received for PCT Patent Application No. PCT/US2014/069355, mailed on Mar. 31, 2015, 11 pages.
Office Action received for Taiwan Patent Application No. 103144802, mailed on Dec. 15, 2015, 5 pages of English Translation and 5 pages of Taiwan Office Action.

*Primary Examiner* — Lex Malsawma
*Assistant Examiner* — Xia L Cross
(74) *Attorney, Agent, or Firm* — Winkle, PLLC

(57) ABSTRACT

Processes for forming interconnection layers having tight pitch interconnect structures within a dielectric layer, wherein trenches and vias used to form interconnect structures have relatively low aspect ratios prior to metallization. The low aspect ratios may reduce or substantially eliminate the potential of voids forming within the metallization material when it is deposited. Embodiments herein may achieve such relatively low aspect ratios through processes that allow for the removal of structures, which are utilized to form the trenches and the vias, prior to metallization.

22 Claims, 16 Drawing Sheets

(56) References Cited

U.S. PATENT DOCUMENTS

2010/0136792 A1 6/2010 Mebarki et al.
2011/0092069 A1* 4/2011 Cheng et al. ................ 438/672
2012/0282779 A1 11/2012 Arnold et al.
2012/0306049 A1* 12/2012 Booth et al. ................. 257/532
2013/0095663 A1 4/2013 Seo et al.
2013/0105877 A1 5/2013 Kim et al.

* cited by examiner

METHODS FOR FORMING INTERCONNECT LAYERS HAVING TIGHT PITCH INTERCONNECT STRUCTURES

TECHNICAL FIELD

Embodiments of the present description generally relate to the field of microelectronic device fabrication, and, more particularly, to forming interconnection layers having tight pitch interconnect structures within a dielectric layer. Trenches and vias, which are used to form the interconnect structures, are fabricated to have relatively low aspect ratios prior to metallization, wherein the low aspect ratios reduced or substantially eliminated the potential of voids forming within the metallization material when it is deposited.

BACKGROUND

The microelectronic industry is continually striving to produce ever faster and smaller microelectronic devices for use in various mobile electronic products, such as portable computers, electronic tablets, cellular phones, digital cameras, and the like. As these goals are achieved, the fabrication of the microelectronic devices becomes more challenging. One such challenging area relates to the interconnect layers that are used to connect the individual devices on a microelectronic chip and/or to send and/or receive signals external to the individual device(s). Interconnect layers generally comprise a dielectric material having conductive interconnects (lines), such as copper and copper alloy, coupled to the individual devices. The interconnects (lines) generally comprise a metal line portion and a metal via portion, wherein the metal line portion is formed in a trench within the dielectric material and the metal via portion is formed within a via opening that extends from the trench through the dielectric material. It is understood that a plurality of interconnection layers (e.g., five or six levels) may be formed to effectuate the desired electrical connections.

As these interconnects are manufactured at smaller pitches (e.g. narrower and/or closer together), it becomes more and more difficult to properly align the trenches and the vias within and between the desired interconnect layer. In particular, during manufacturing, the location of the via edges with respect to the interconnect layer or line it is to contact will have variation (e.g. be misaligned) due to natural manufacturing variation. A via, however, must allow for connection of one interconnect layer to the desired underlying interconnect layer or line without erroneously connecting to a different interconnect layer or line. If the via is misaligned and contacts the wrong metal feature (e.g. misses line below and/or connects two lines), the microelectronic chip may short circuit resulting in degraded electrical performance. One solution to address this issue is to reduce the trench and the via size (e.g. making the via narrower). However, reducing the trench and the via size means that the aspect ratio of the openings of the trench and the via may be high. As will be understood to those skilled in the art, high aspect ratio may result in a potential reduced yield due to voiding during the deposition of conductive material (metallization) used to form the interconnects.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
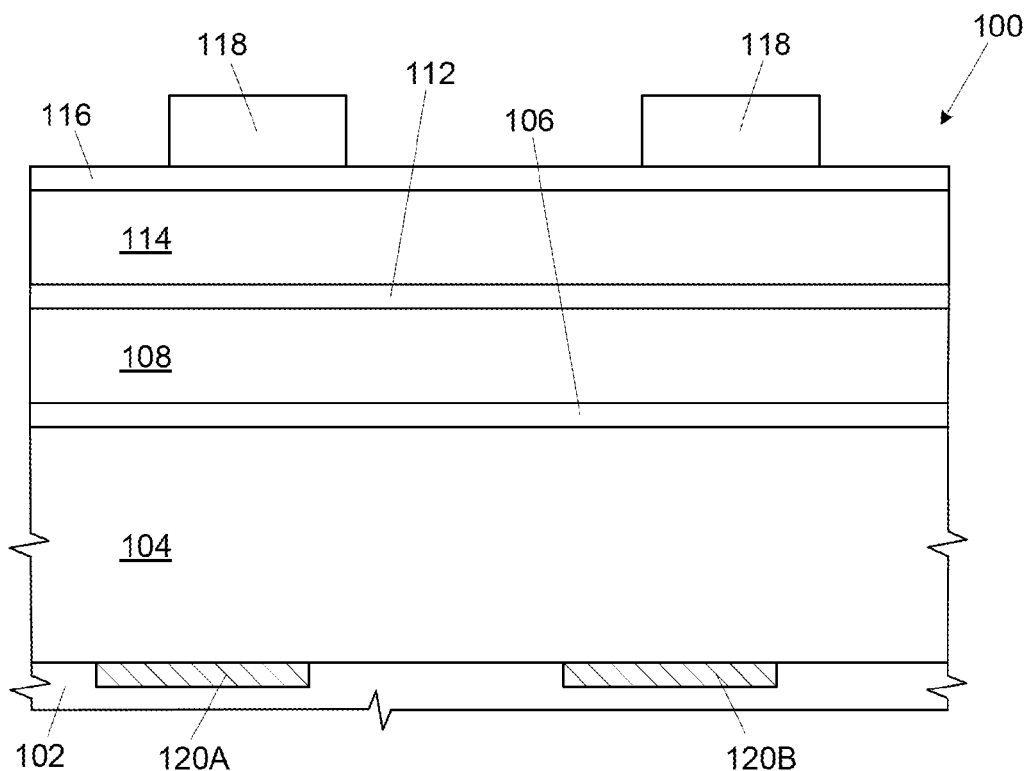
FIGS. 1-28 illustrate cross-sectional views of a method of forming an interconnection layer, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description include forming interconnection layers having tight pitch interconnect structures within a dielectric layer, wherein trenches and vias used to form the interconnect structures have relatively low aspect ratios prior to metallization. The low aspect ratios may reduce or substantially eliminated the potential of voids forming within the metallization material when it is deposited. Embodiments of the present description may achieve such relatively low aspect ratios through processes that allows for the removal of structures, which are utilized to form the trenches and the vias, prior to metallization.

FIG. 1 illustrates a stacked layer for backbone patterning. The stacked layer 100 may comprise a dielectric layer 104 formed on a substrate 102, a first hardmask layer 106 formed on the dielectric layer 104, a backbone material 108 formed on the first hardmask layer 106, a second hardmask layer 112 formed on the backbone material 108, a sacrificial hardmask layer 114 formed on the second hardmask layer 112, an first antireflective coating 116 formed on the sacrificial hardmask layer 114, and a first photoresist material 118 patterned on the first antireflective coating 116. The components of the stacked layer 100 may be deposited by any known techniques, which, for the purpose of clarity and conciseness, will not be discussed herein.

The substrate 102 may be a microelectronic chip, a wafer substrate (e.g., a portion of a silicon wafer), or the like, having circuit devices (not shown), including transistors or the like, wherein contact structures (illustrated as first contact structure 120A and second contact structure 120B) may be in electrical communication with the circuit devices. Furthermore, the substrate 102 may be an interconnection layer, wherein the contact structures 120A, 120B may be interconnects, as will be discussed.

In one embodiment, the dielectric layer 104 may be a material having, for example, a dielectric constant (k) less than the dielectric constant of silicon dioxide ($SiO_2$) (e.g., a "low k" dielectric material). Representative low k dielectric materials include materials containing silicon, carbon, and/or oxygen which may be referred to as polymers and that are known in the art. In one embodiment, the dielectric layer 104 may be porous.

In one embodiment, the first hardmask layer 106, the second hardmask layer 112, and the sacrificial hardmask layer 114 may be dielectric materials. Representative dielectric materials may include, but are not limited to, various oxides, nitrides, and carbides, for example, silicon oxide, titanium oxide, hafnium oxide, aluminum oxide, oxynitride, zirconium oxide, hafnium silicate, lanthanum oxide, silicon nitride, boron nitride, amorphous carbon, silicon carbide, aluminum nitride, and other similar dielectric materials. In one embodiment, first hardmask layer 106 is deposited, for example, by a plasma deposition process, to a thickness to serve as a mask to underlying dielectric layer 104 (e.g., to protect from undesired modification of the dielectric material from energy used in subsequent process steps). In one embodiment, a representative thickness is a thickness that will not significantly affect an overall dielectric constant of the combined dielectric layer 104 and first hardmask layer 106, but at most will marginally affect such overall dielectric constant. In one embodiment, a representative thickness is on the order of 30 angstroms (Å)±20 Å. In another embodiment, a representative thickness is on the order of two to five nanometers (nm).

The backbone material 108 may include, but is not limited to, polysilicon, amorphous silicon, amorphous carbon, silicon nitride, silicon carbide, and germanium.

Figure 2:
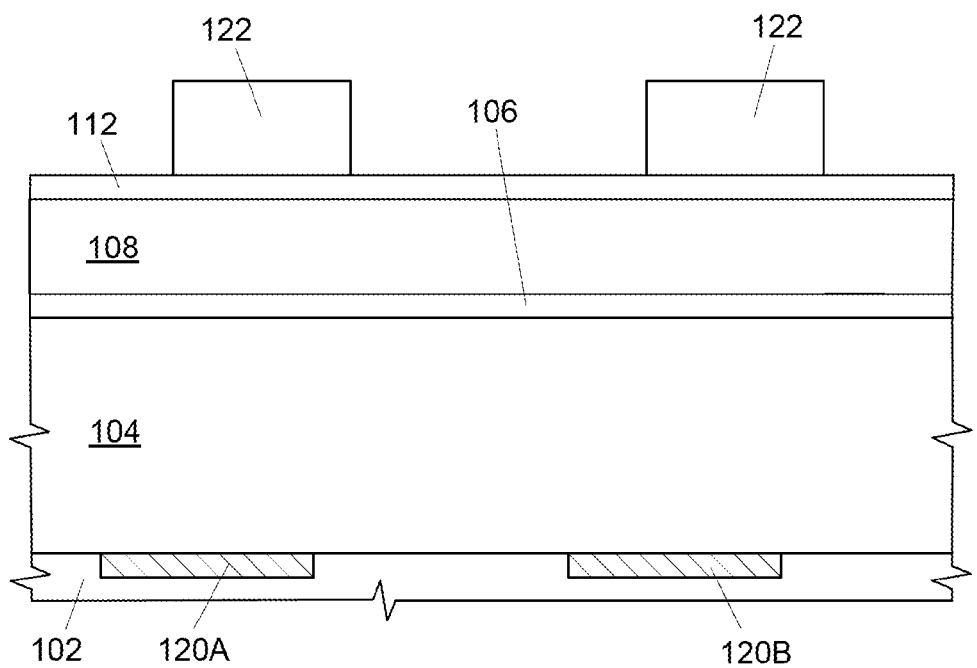

As shown in FIG. 2, the stacked layer 100 of FIG. 1 may be etched wherein the second hardmask layer 112 acts as an etch stop. The etching results in the first photoresist material 118 pattern being transferred into the sacrificial hardmask layer 114. As shown in FIG. 2, the first photoresist material 118 and the first antireflective coating 116 may be removed, resulting in patterned sacrificial hardmask structures 122.

Figure 3:
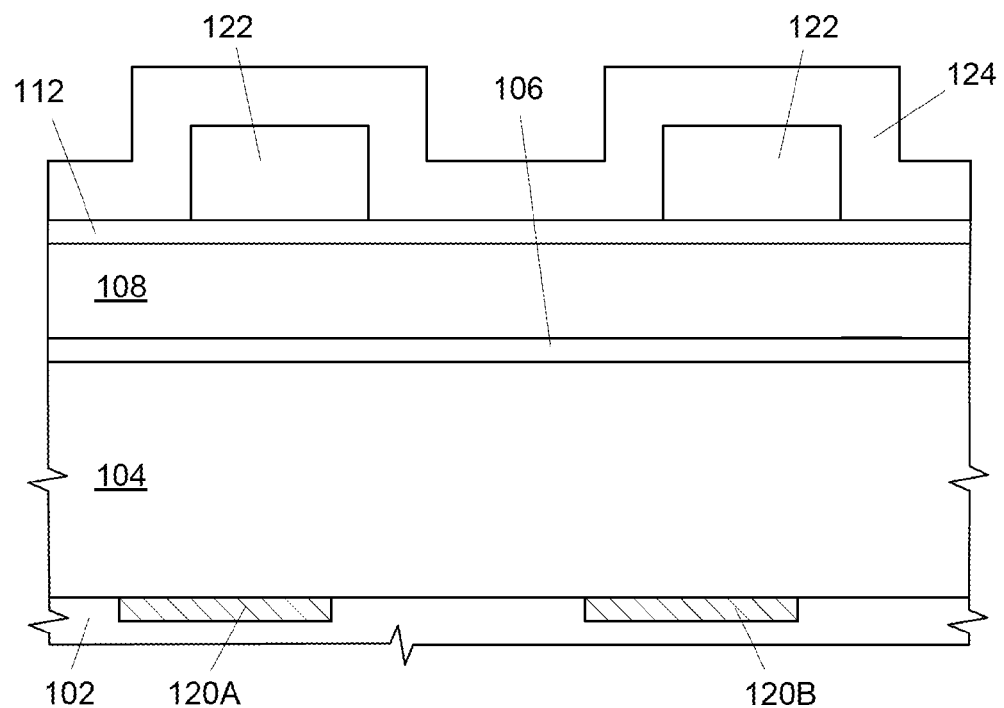
Figure 4:
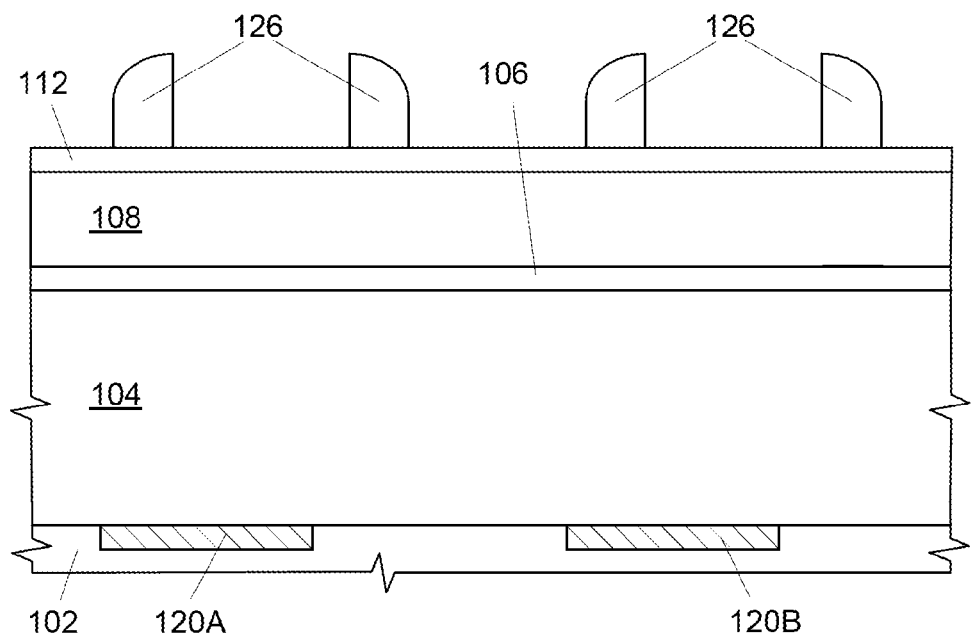

As shown in FIG. 3, a conformal spacer material layer 124 may be deposited over the structure shown in FIG. 2. The conformal spacer material layer 124 may be deposited by any conformal deposition techniques known in the art, and may comprise any appropriate material, including, but not limited to, silicon dioxide, silicon nitride, silicon carbide, and amorphous silicon. As shown in FIG. 4, the conformal spacer material layer 124 may be anisotropically etched and the sacrificial hardmask structures 122 may be removed to form first spacers 126.

Figure 5:
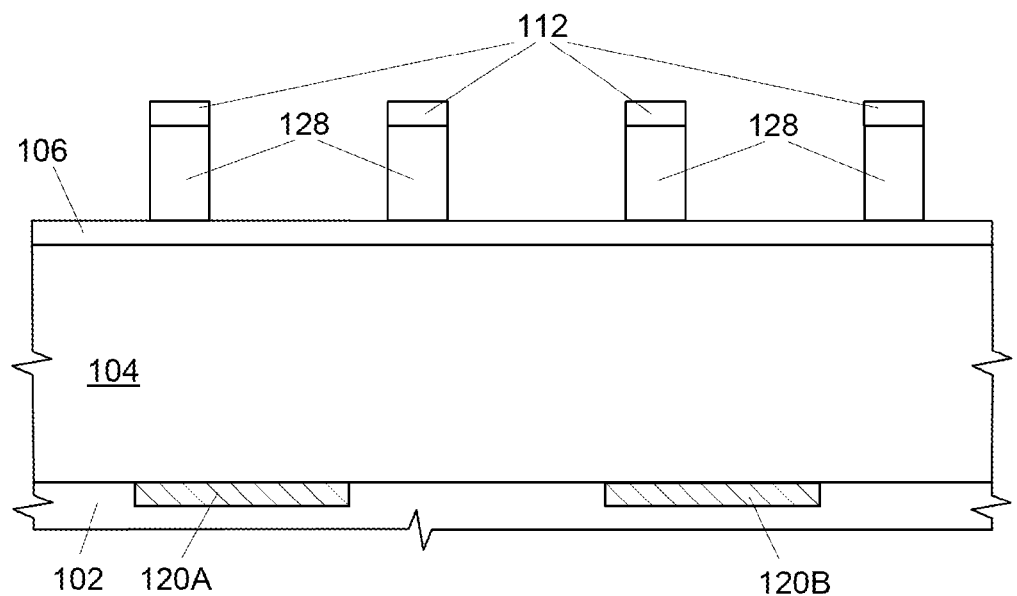

As shown in FIG. 5, the structure of FIG. 4 may be etched wherein the first hardmask layer 106 acts as an etch stop. The etching results in the pattern of the first spacers 126 being transferred into the backbone material 108, resulting in patterned backbone structures 128 capped with a portion of the second hardmask layer 112. In one embodiment, the second hardmask layer 112 may remain to protect the backbone material 108 during subsequent processing, such as the formation of trenches and vias, as will be discussed. In another embodiment, the second hardmask layer 112 may be removed.

Figure 6:
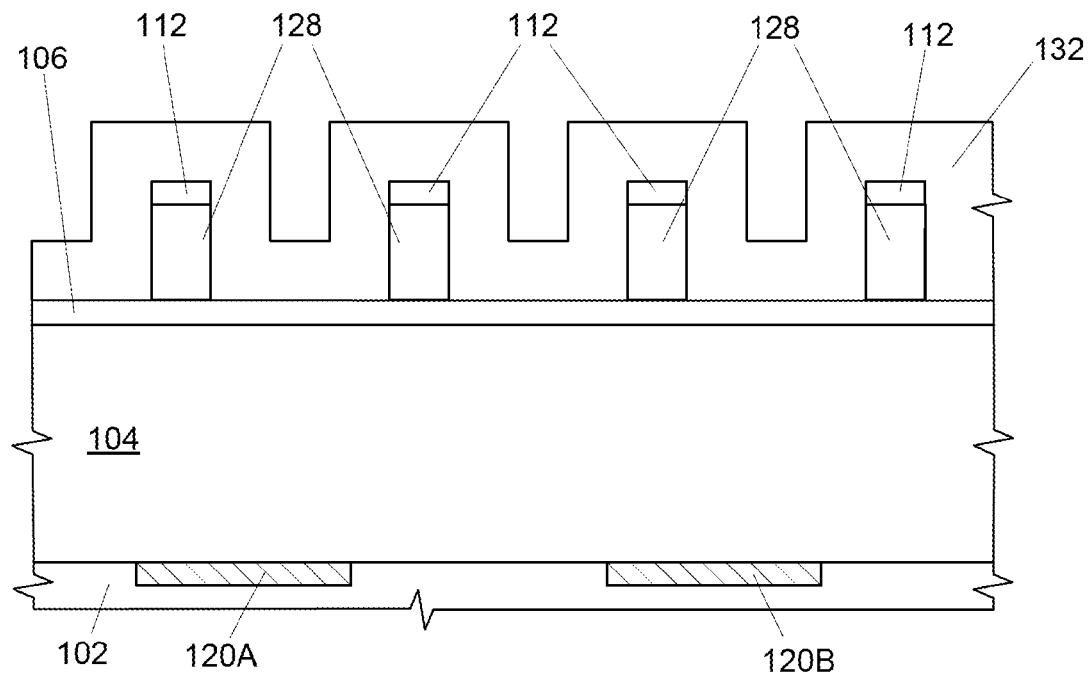

As shown in FIG. 6, a conformal side spacer material layer 132 may be deposited over the structure shown in FIG. 5. The conformal side spacer material layer 132 may be deposited by any conformal deposition technique known in the art and may comprise any appropriate material, including, but not limited to, silicon dioxide, silicon nitride, titanium oxide, hafnium oxide, zirconium oxide, aluminum nitride, and amorphous silicon.

Figure 7:
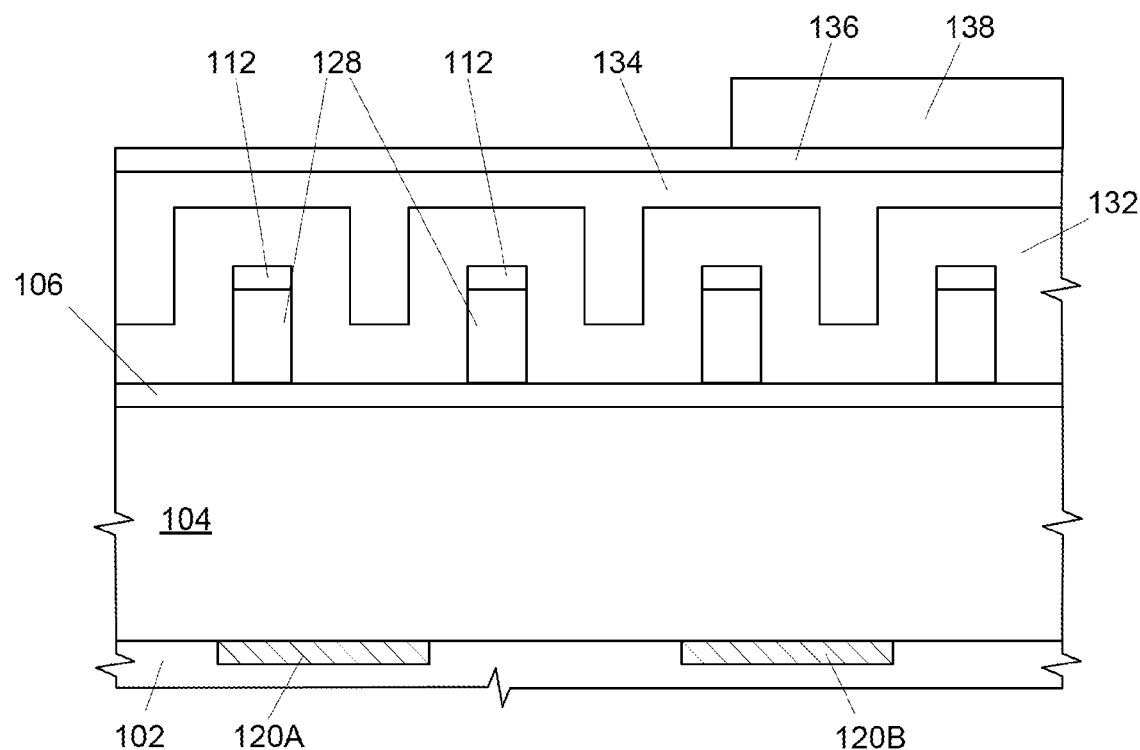
Figure 8:
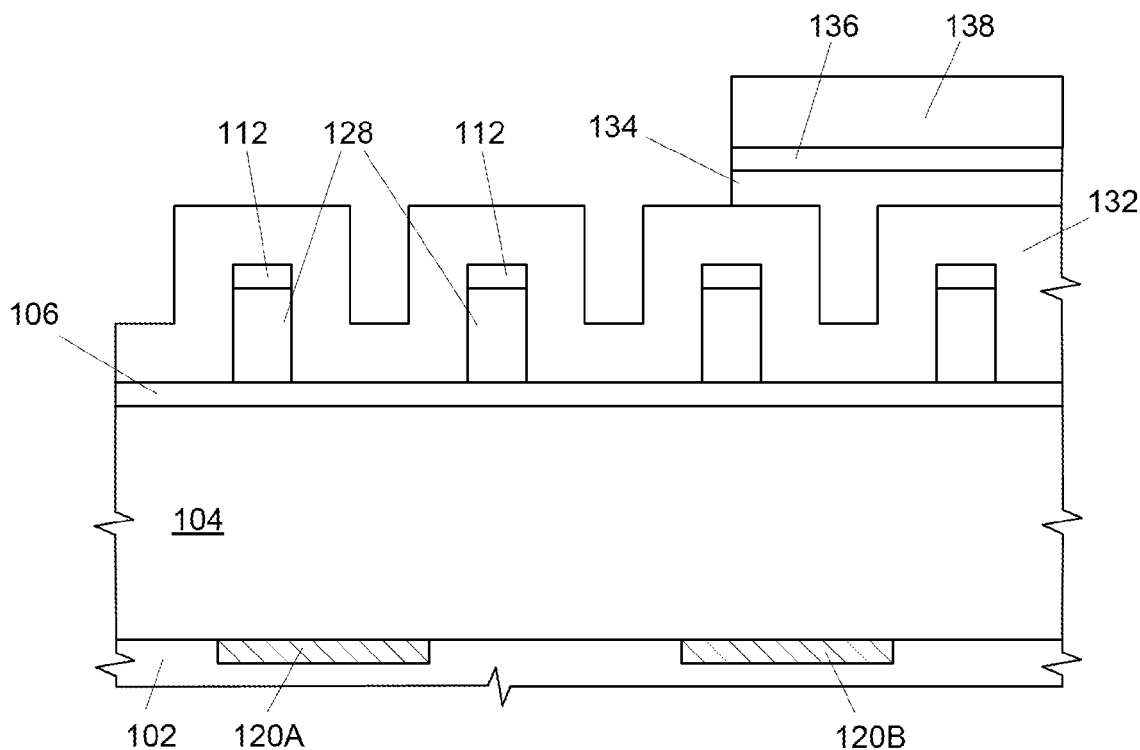
Figure 9:
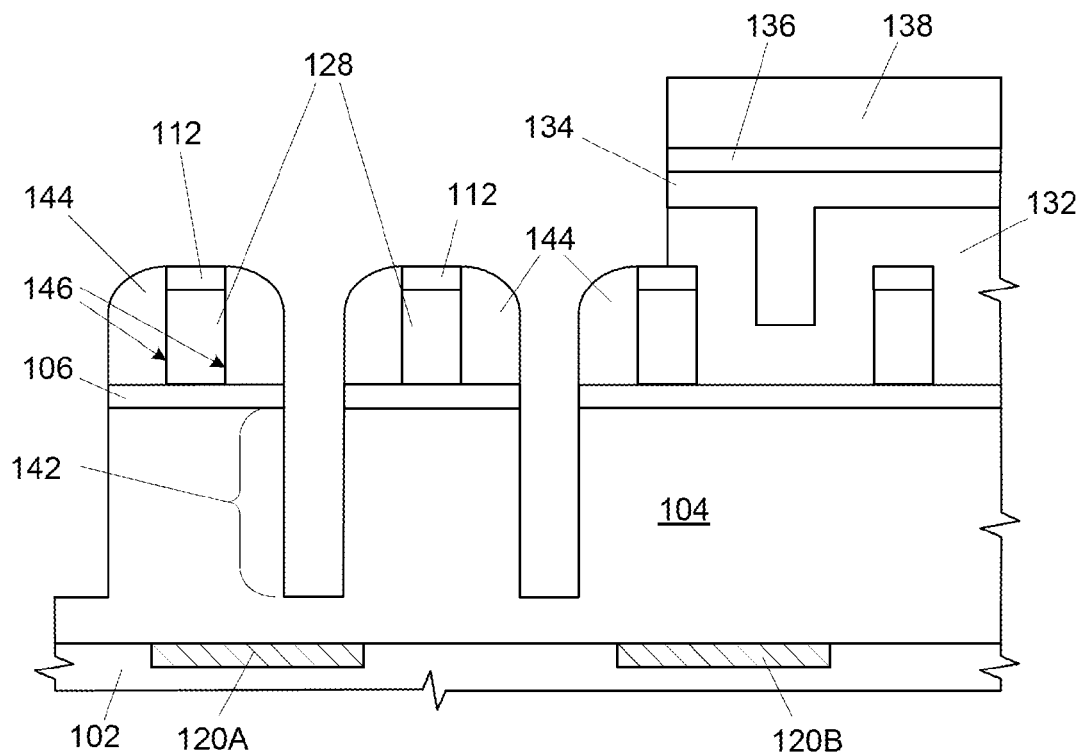

As shown in FIG. 7, a third hardmask 134 may be deposited over the conformal side spacer material layer 132, a second antireflective coating 136 may be deposited over the third hardmask 134, and a second photoresist material 138 may be patterned on the second antireflective coating 136. As shown in FIG. 8, the structure of FIG. 7 may be etched to remove a portion of the third hardmask 134 and a portion of the second antireflective coating 136 not protected by the patterned second photoresist material 138 (see FIG. 7), wherein the conformal side spacer material layer 132 acts as an etch stop. As shown in FIG. 9, the structure of FIG. 8 may be anisotropically etched through the conformal side spacer material layer 132 between adjacent patterned backbone structures 128, through a portion of the first hardmask layer 106, and into the dielectric layer 104, thereby forming at least one first trench 142 within the dielectric layer 104, wherein portions of the conformal side spacer material layer 132 may be protected from etching by the patterned third hardmask 134. It is understood that the trench 142 may extend perpendicularly from the plane of FIG. 9. The etching of the conformal side spacer material layer 132 may result in the formation of side spacers 144 along sides 146 of the patterned backbone structures 128.

Figure 10:
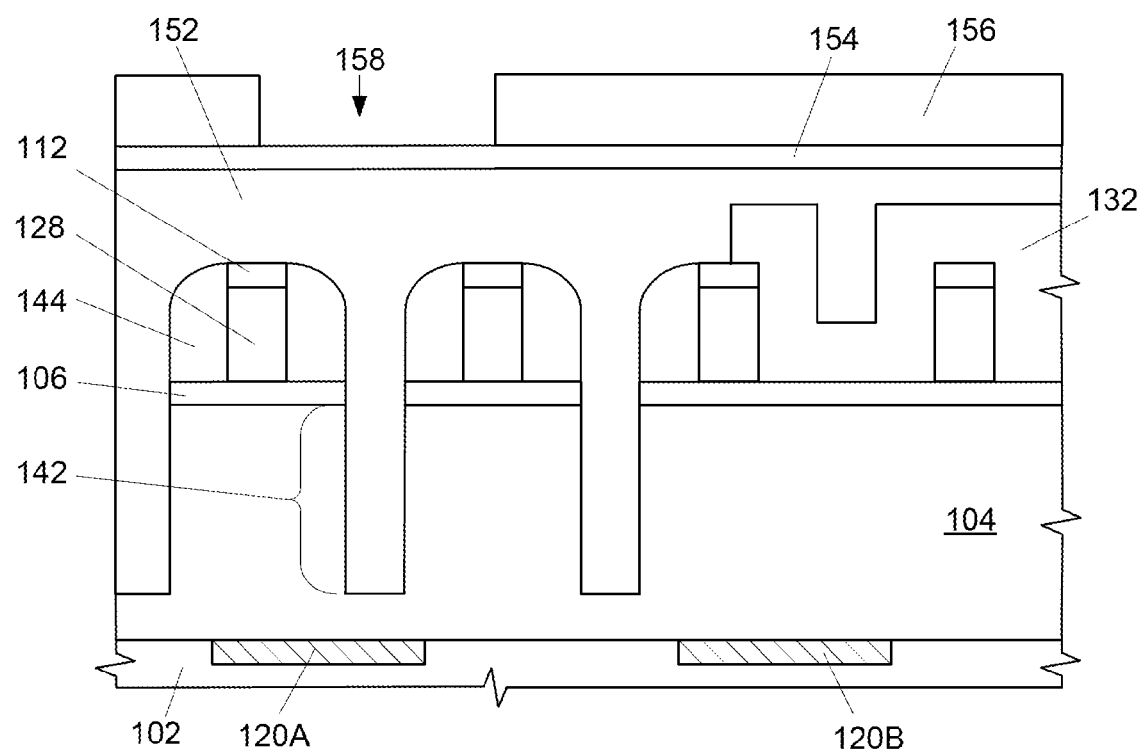
Figure 11:
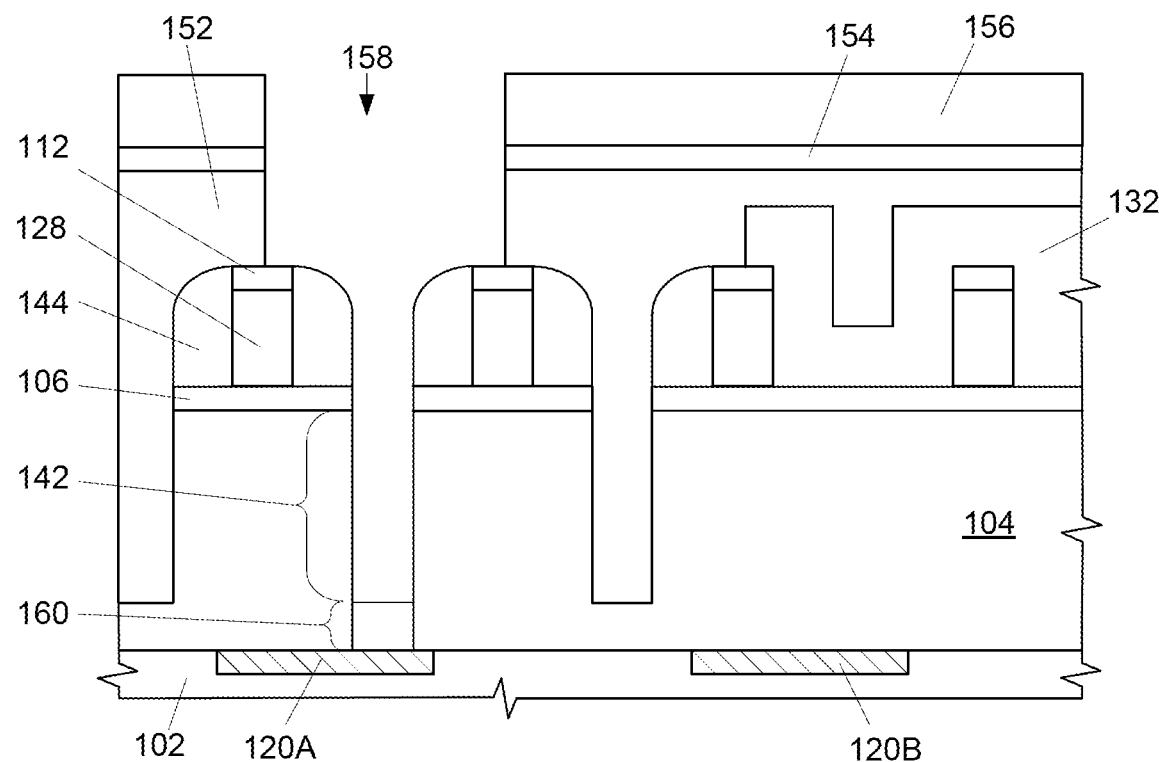
Figure 12:
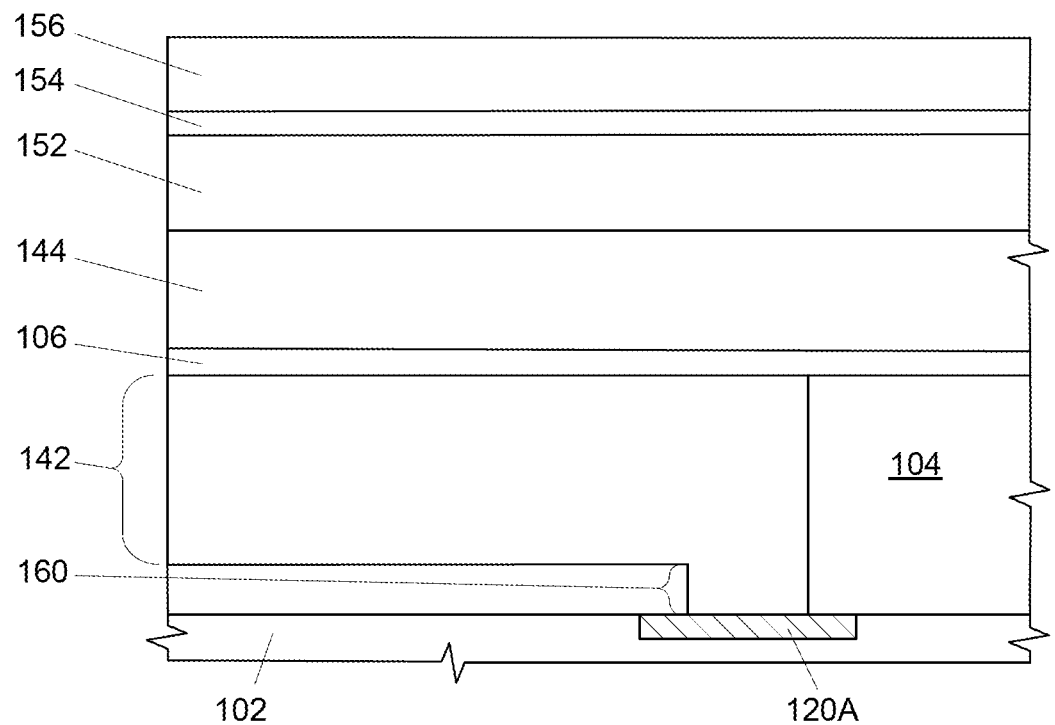

As shown in FIG. 10, the third hardmask 134, the second antireflective coating 136, and the second photoresist material 138 may be removed and a fourth hardmask 152 may be deposited, a third antireflective coating 154 may be deposited over the fourth hardmask 152, and a third photoresist material 156 may be patterned on the third antireflective coating 154 to have at least one opening 158 therein aligned with a respective first trench 142. As shown in FIGS. 11 and 12, a portion of the fourth hardmask 152 may be etched through the opening 158 and a further portion of the dielectric material 104 may be etched to form a first via 160 extending from the first trench 142 to a respective first contact structure 120A.

Figures 13, 14:
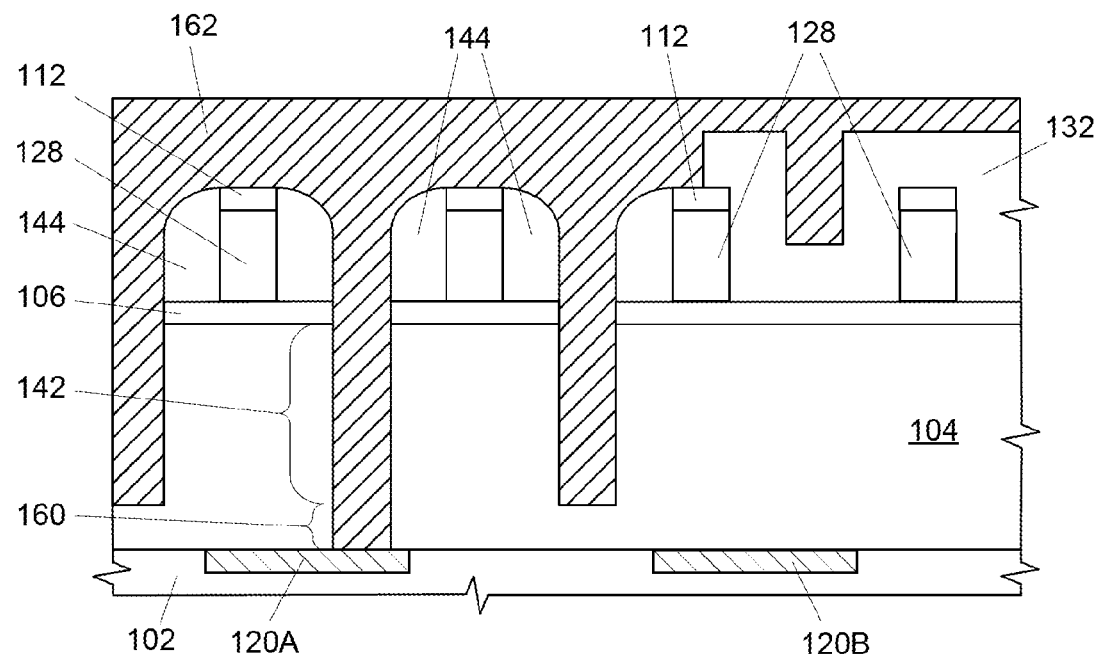

As shown in FIG. 13, the fourth hardmask 152, the third antireflective coating 154, and the third photoresist material 156 may be removed and a via hardmask 162 may be deposited. In one embodiment, the via hardmask 162 may be selected from materials that may be selectively removable in presence of material used for the dielectric material 104 and the first hardmask layer 106 and any underlying metals, such as the material used for the contact structures 120A, 120B. In an embodiment, the via hardmask 162 may be a carbon hardmask, such as an amorphous carbon material, as will be understood to those skilled in the art. In another embodiment, the via hardmask 162 may be metal or metal nitrides, such as titanium nitride, cobalt, ruthenium, or combination thereof, that are selectively removable to underlaying metals.

As shown in FIG. 14, the via hardmask 162 may be etched back to remove a portion of the via hardmask 162 from the first trenches 142 while leaving a portion of the via hardmask 162 within the first via 160. It is understood that a portion of the via hardmask 162 may remain in the first trenches 142.

Figure 15:
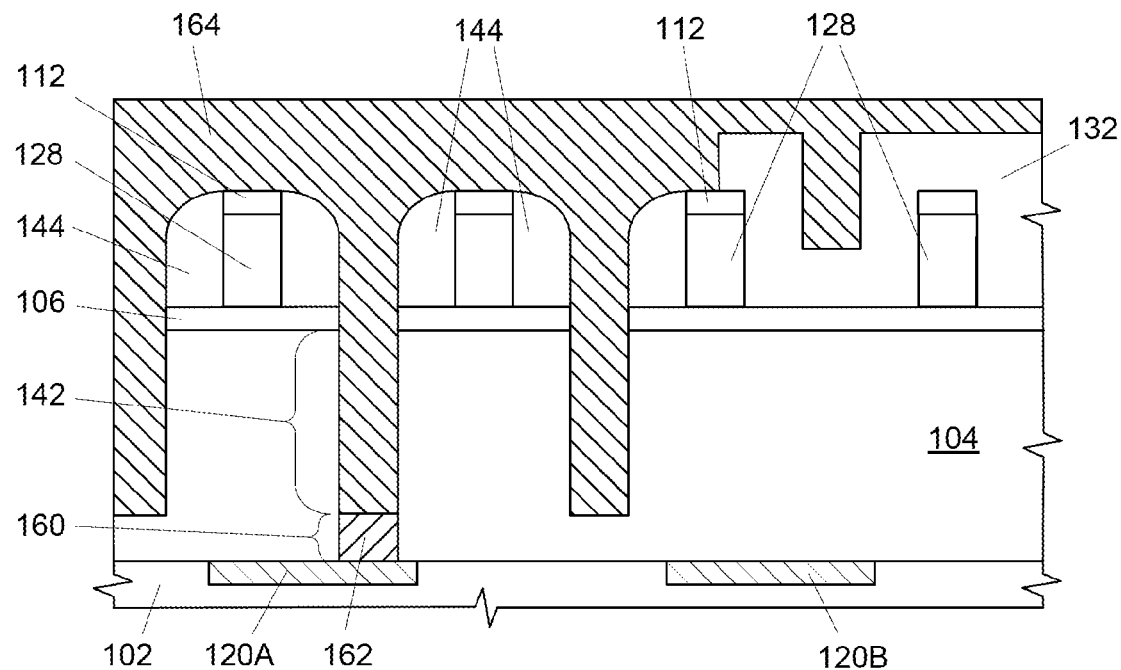

As shown in FIG. 15, a sacrificial material 164 may be deposited over the structure of FIG. 14, wherein the sacrificial material 164 is disposed within the first trenches 142. In one embodiment, the sacrificial material 164 may be selected from materials that can mechanically and chemically sustain further processing steps and that is selectively removable in presence of material used for the dielectric layer 104 and any underlying metals, such as the material used for the contact structures 120A, 120B. In an embodiment, the sacrificial material 164 may include, but is not limited to, titanium oxide, titanium nitride, ruthenium, and cobalt.

Figure 16:
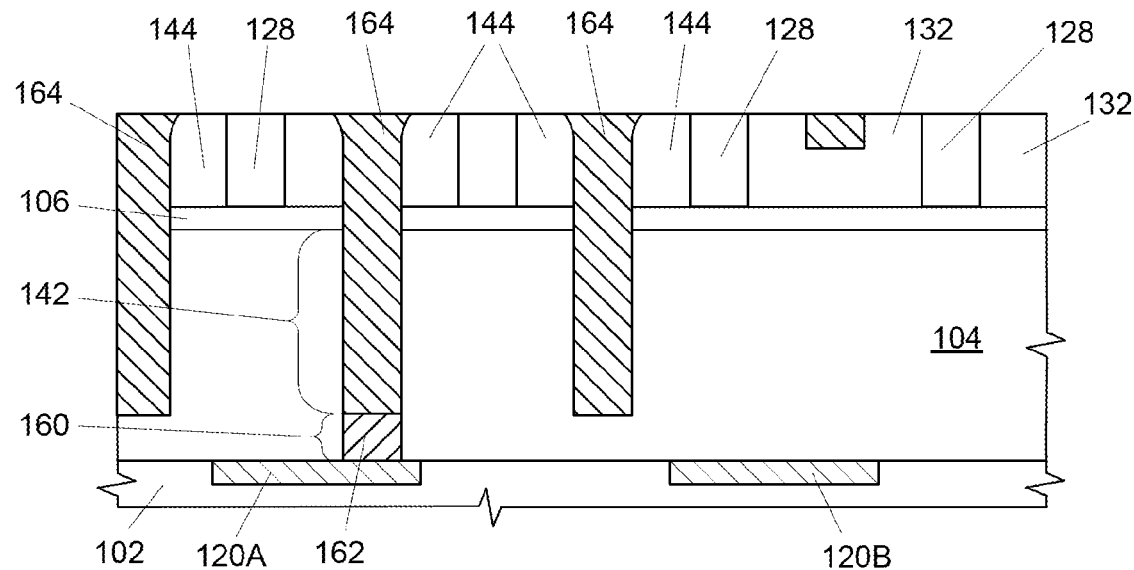

As shown in FIG. 16, the structure of FIG. 15 may be polished, such as by chemical mechanical planarization, to remove a portion of the sacrificial material 164 and the second hardmask layer 112 (if present) and to expose the backbone structures 128.

Figure 17:
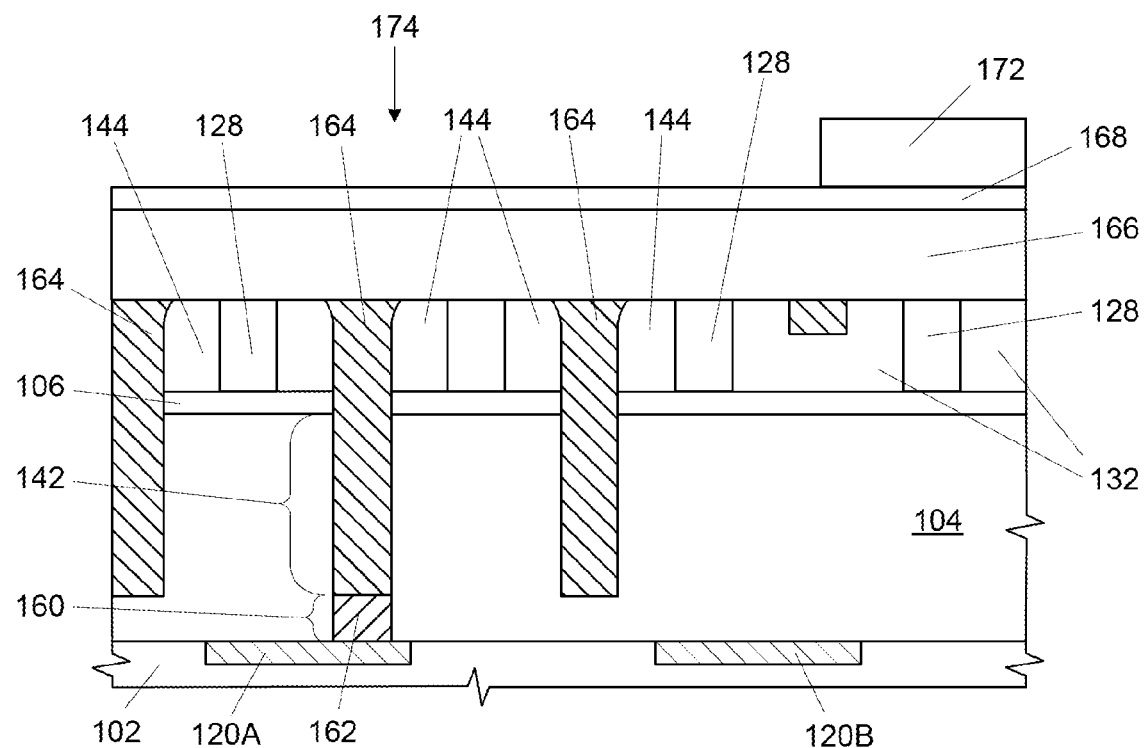
Figure 18:
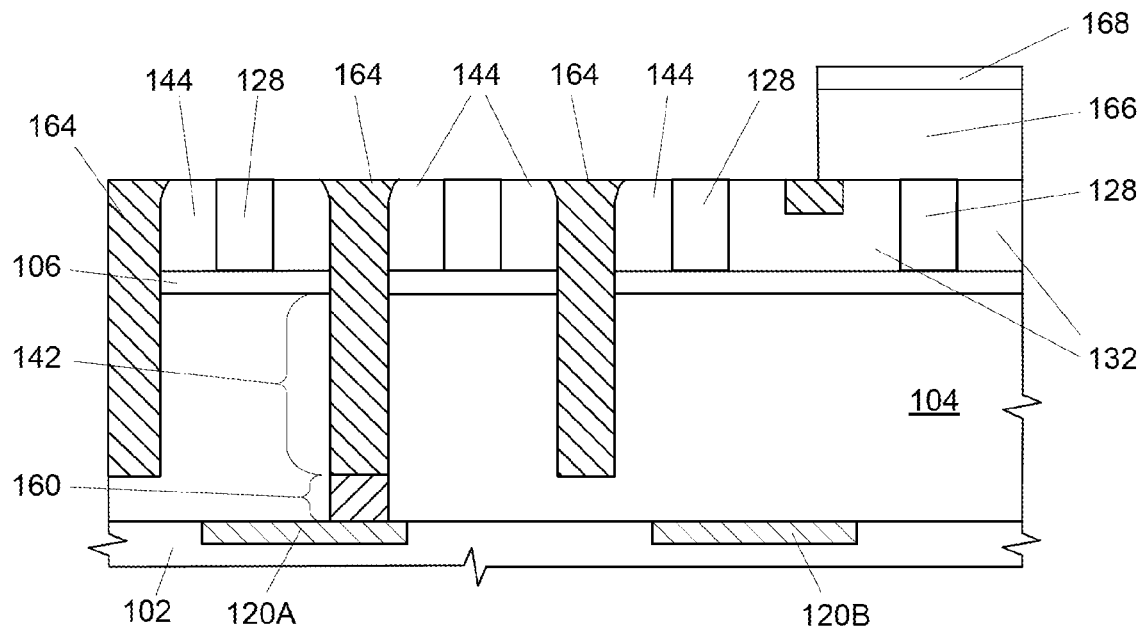
Figure 19:
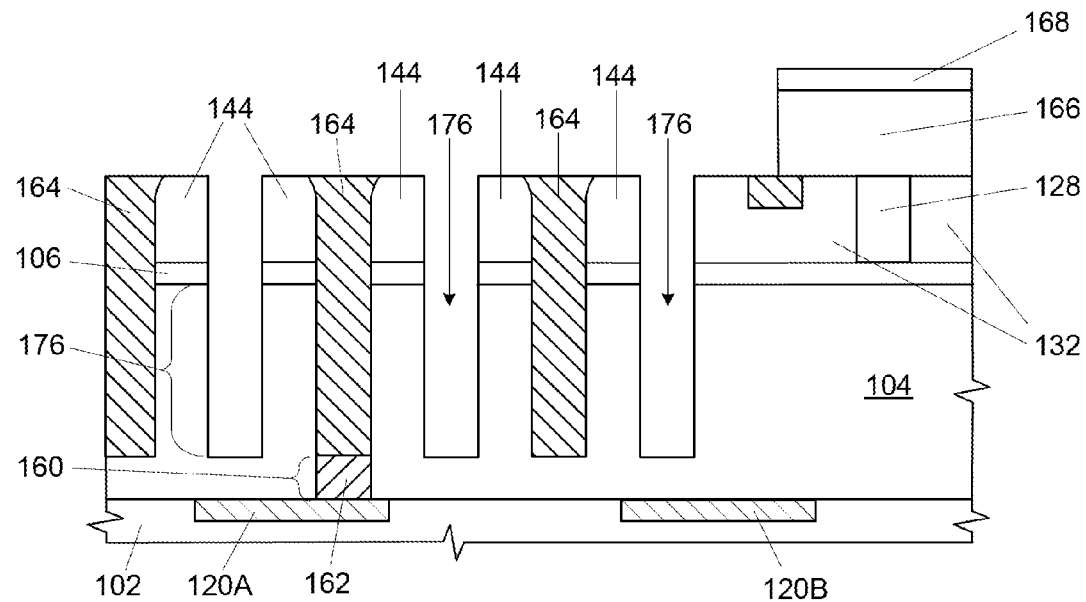

As shown in FIG. 17, a fifth hardmask 166, such as a carbon hardmask, may be deposited over the structure of FIG. 16, a fourth antireflective coating 168 may be deposited over the fifth hardmask 166, and a fourth photoresist material 172 may be patterned on the fourth antireflective coating 168 to have at least one opening 174 therein. As shown in FIG. 18, the fifth hardmask 166 may etched to expose a desired portion of the structure of FIG. 17. As shown in FIG. 19, the backbone structures 128 (see FIG. 18) may be etched away, wherein the etching continues through a portion of the first hardmask layer 106 exposed by the removal of the backbone structures 128 and into the dielectric layer 104, thereby forming at least one second trench 176 within the dielectric layer 104. In one embodiment, the structure of FIG. 19 may be exposed to a plasma of reactive gases (e.g., fluorocarbons, oxygen, chlorine and/or boron trichloride) which are capable of etching backbone structures 128, first hardmask layer 106, and dielectric layer 104 to a desired depth without etching side spacers 144 and sacrificial material 164.

Figure 20:
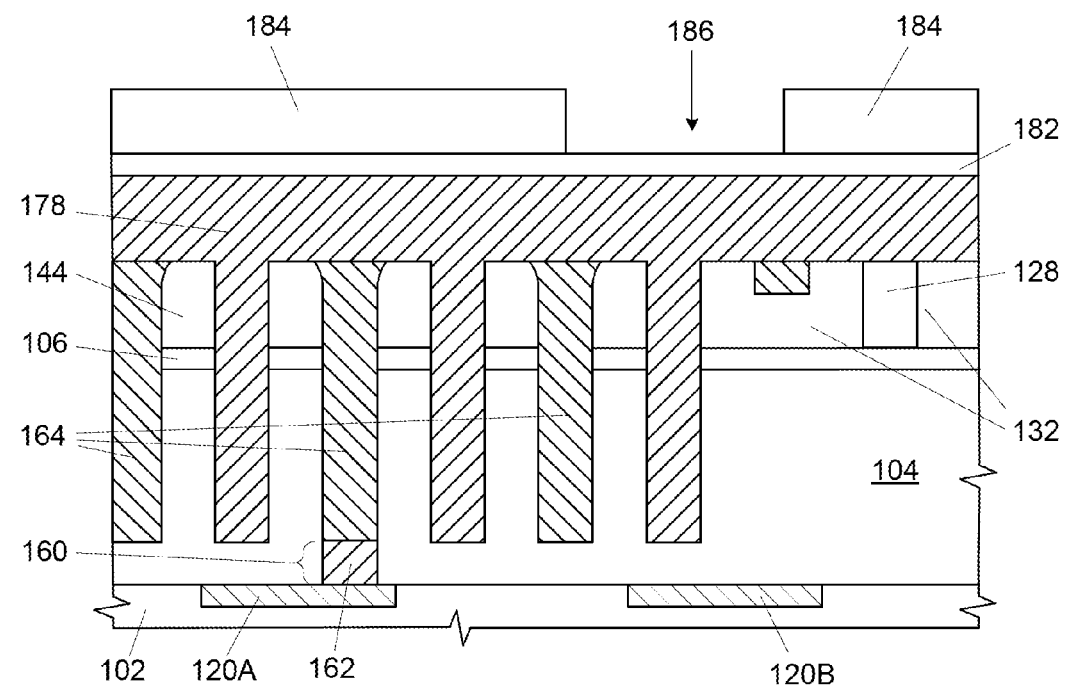
Figure 21:
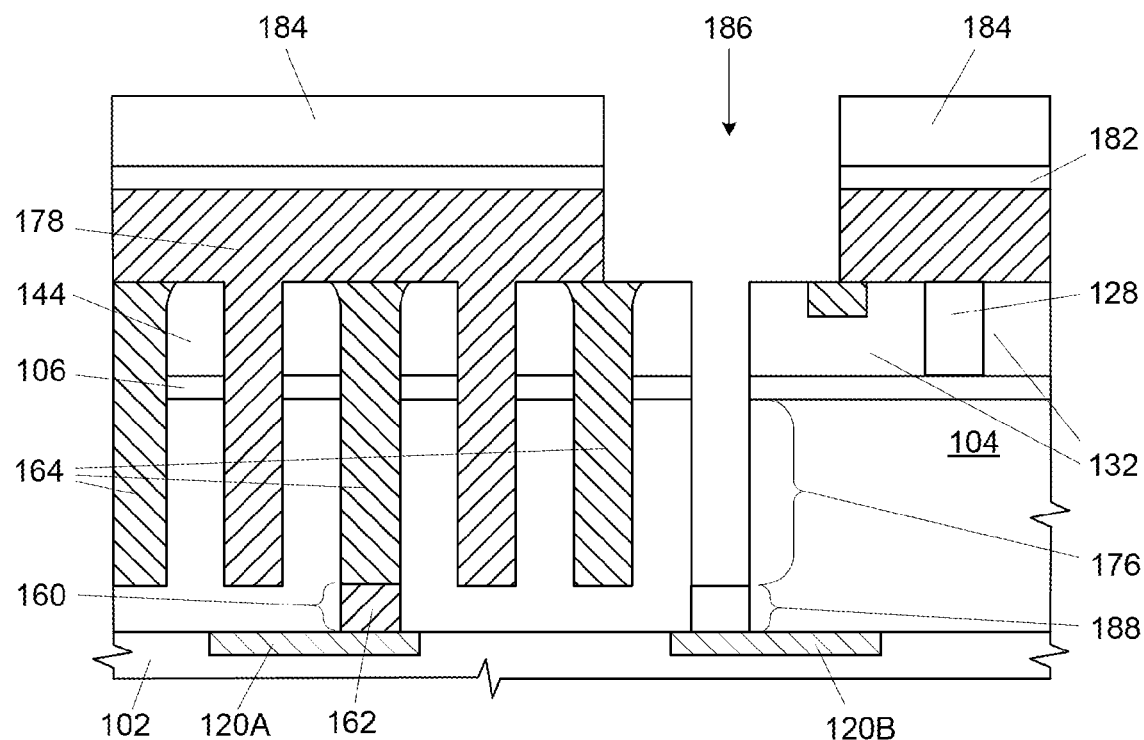

As shown in FIG. 20, the remaining fifth hardmask 166 and fourth antireflective coating 168 may be removed and a sixth hardmask 178, such as a carbon hardmask, may be deposited over the structure of FIG. 19 filling the second trenches 176, a fifth antireflective coating 182 may be deposited over the sixth hardmask 178, and a fifth photoresist material 184 may be patterned on the fifth antireflective coating 182 to have at least one opening 186 therein aligned with a respective second trench 176 (see FIG. 19). As shown in FIG. 21, a portion of the sixth hardmask 178 may be etched through the opening 186 and a further portion of the dielectric material 104 may be etched to form a second via 188 extending from the second trench 176 to a respective second contact structure 120B.

Figure 22:
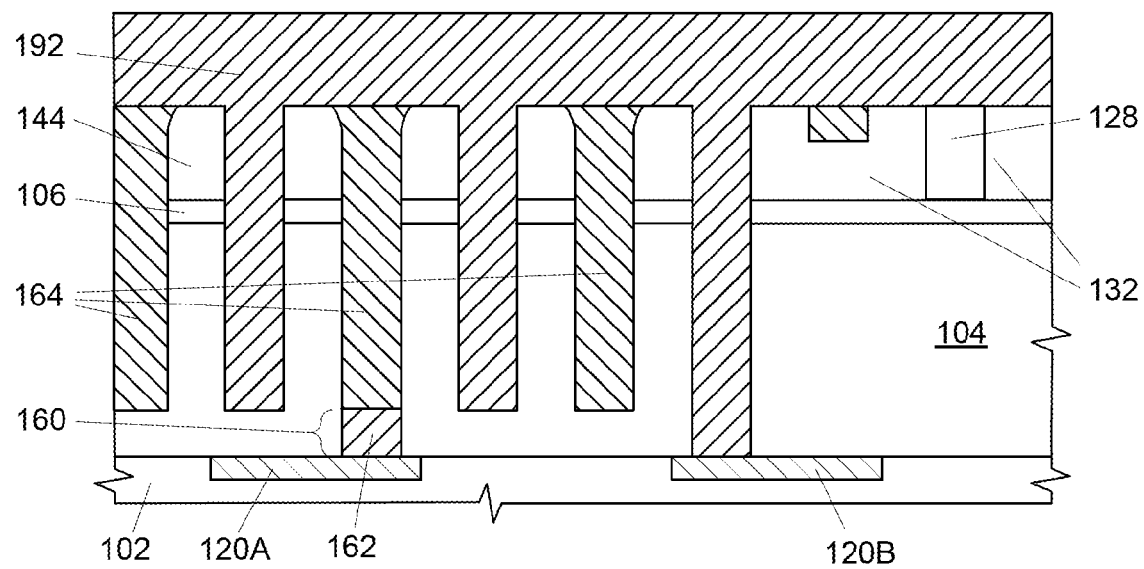
Figure 23:
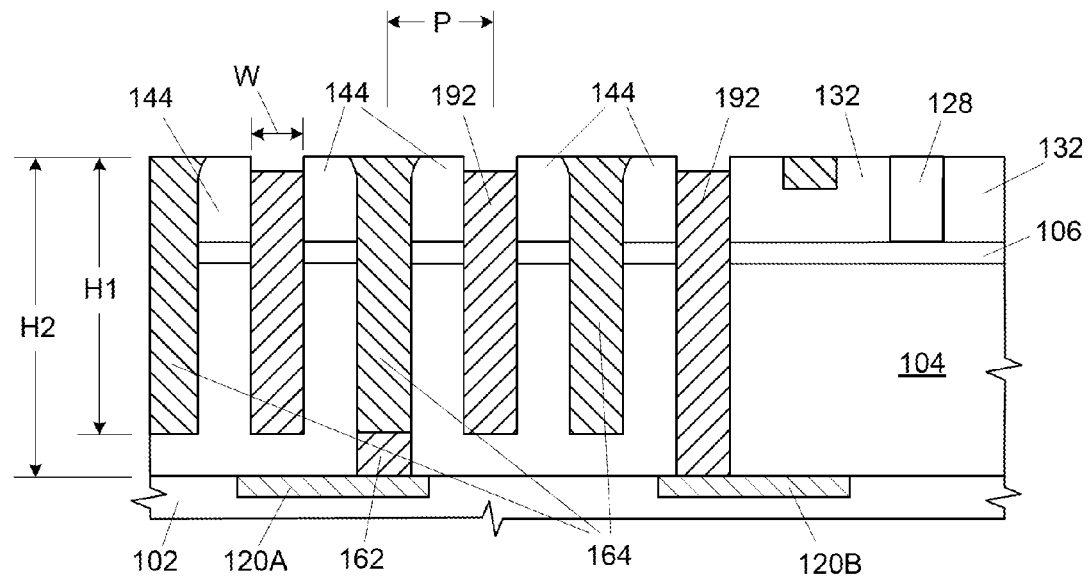

As shown in FIG. 22, the sixth hardmask 178, the fifth antireflective coating 182, and the fifth photoresist material 184 (see FIG. 20) may be removed and replaced with a fill material 192 which extends into the second trenches 176 and second vias 188 (see FIG. 21). In one embodiment, the fill material 192 may comprise a carbon hardmask, such as an amorphous carbon material. As shown in FIG. 23, the fill material 192 may be optionally etched back to expose the side spacers 144 while leaving a portion of the eighth hardmask 192 within the second trenches 176 and second vias 188 (see FIG. 21).

Figure 24:
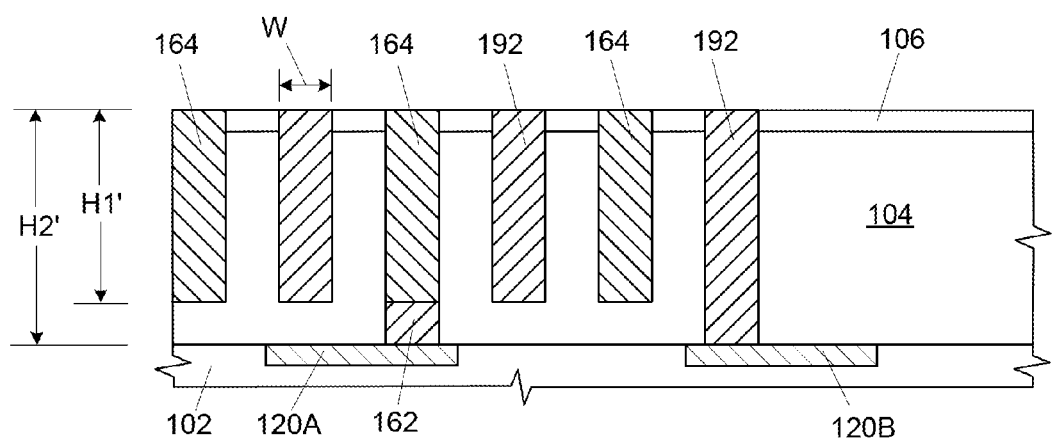
Figure 25:
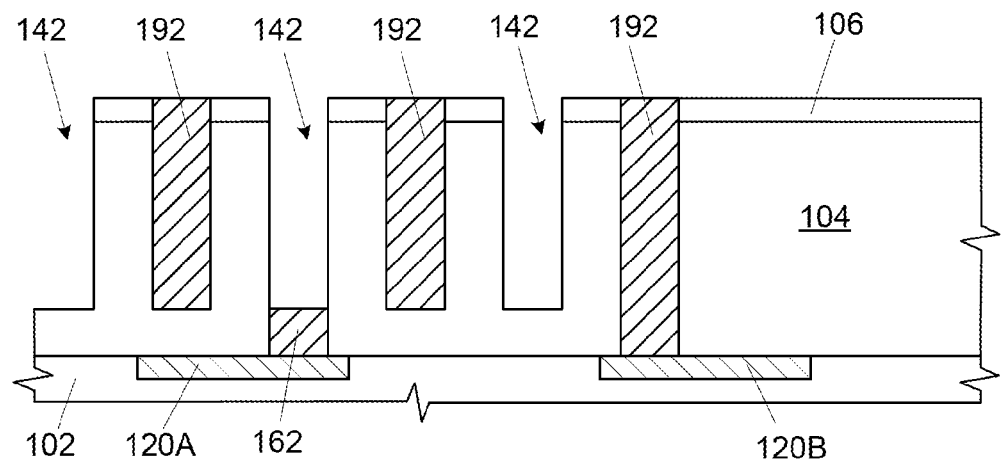
Figure 26:
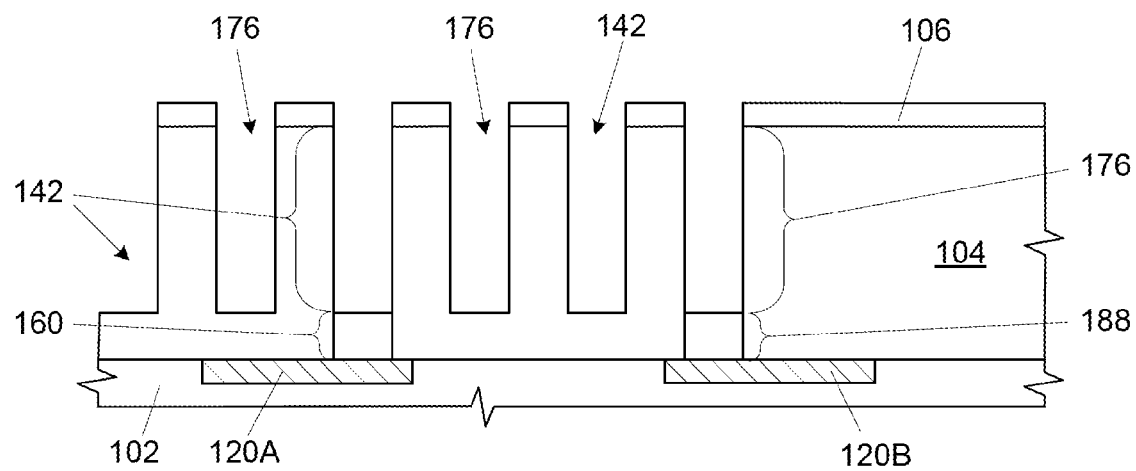

As shown in FIG. 24, the structure of FIG. 23 may be polished, such as by chemical mechanical polishing, to expose the first hardmask layer 106. The sacrificial material 164 may then be selectively removed from the first trenches 142, as shown in FIG. 25. As shown in FIG. 26, the eighth hardmask 192 may be selectively removed from the second trenches 176 and the second vias 188, and the via hardmask 162 may be removed from the first vias 160. In one embodiment, where the eighth hardmask 192 and the via hardmask 162 are carbon hardmasks, as previously discussed, they may be removed with a single ashing and cleaning process, as known in the art.

Figure 27:
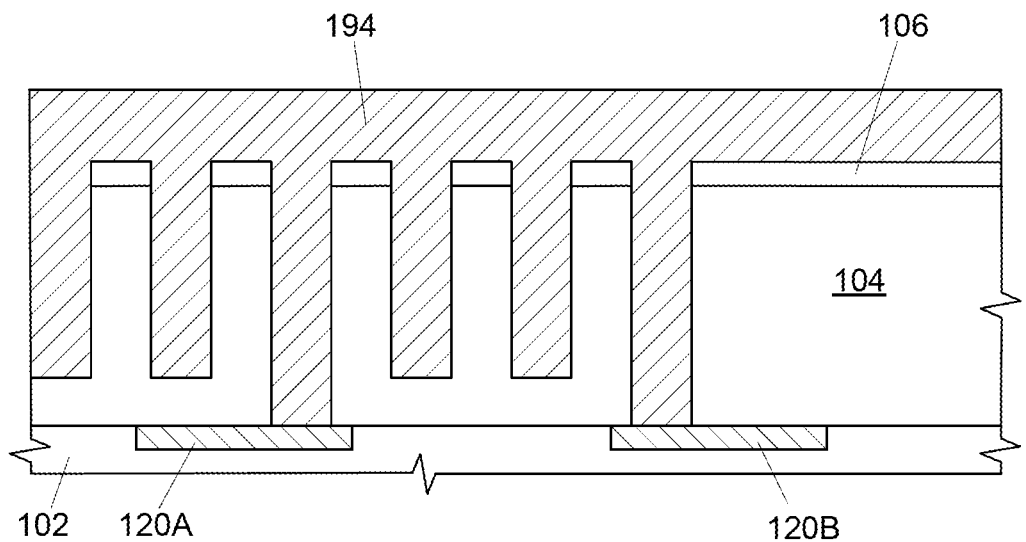

As shown in FIG. 27, a conductive material 194 may be deposited over the structure of FIG. 26 to fill the first trenches 142, the first vias 160, the second trenches 176, and the second vias 188. The conductive material 194 may be made of any appropriate conductive material, such as metals including, but not limited to copper, aluminum, tungsten, cobalt, ruthenium, and the like, with or without a liner material, such as tantalum, tantalum nitride, or titanium nitride. It is understood that the first hardmask layer 106 may be removed prior to the deposition of the conductive material 194.

Figure 28:
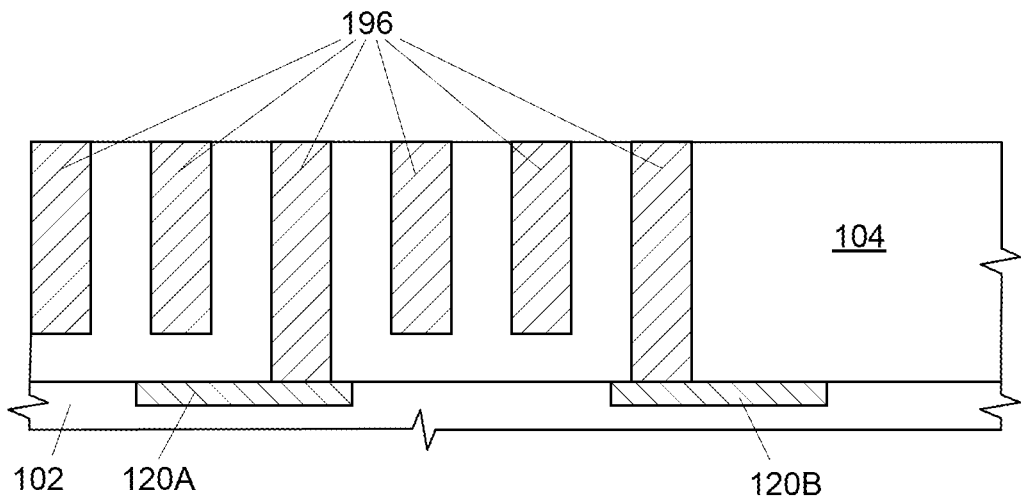

As shown in FIG. 28, the structure of FIG. 27 may be polished to remove a portion of conductive material 194 and the first hardmask layer 106 (if present) exposing the dielectric material 104, thereby forming interconnects 196. The interconnects 196 may be, for example, wiring lines that are used to provide connections to and between devices connected to other interconnect layers or lines. The interconnects 196 may have a similar size and dimensions, and may further be parallel to one another. In addition, a pitch P (see FIG. 23) of the interconnects 196 may be relatively small such that they are considered to have a tight pitch, such as an interconnect pitch P of less than about 80 nm.

Referring back to FIG. 23, prior to the polishing to removing the side spacers 144 and other structures above the first hardmask layer 106 as shown in FIG. 24, the aspect ratio (i.e. height to width) of the trenches (see first trenches 142 and second trenches 176 in FIG. 26) can be greater than about 8:1 (e.g. H1:W) and the aspect ratio of the vias (see first vias 160 and second vias 188 of FIG. 26) can be greater than about 10:1 (e.g. H2:W) for trenches having a pitch P of less than about 40 nm. As illustrated in FIG. 24, after polishing, the aspect ratio (i.e. height to width) of the trenches (e.g. H1':W) and the vias (e.g. H2':W) can be less than about 4:1. As previously discussed, low aspect ratios can reduce or substantially eliminated the potential of voids forming within the conductive material 194 when it is deposited (see FIG. 27).

Figure 29:
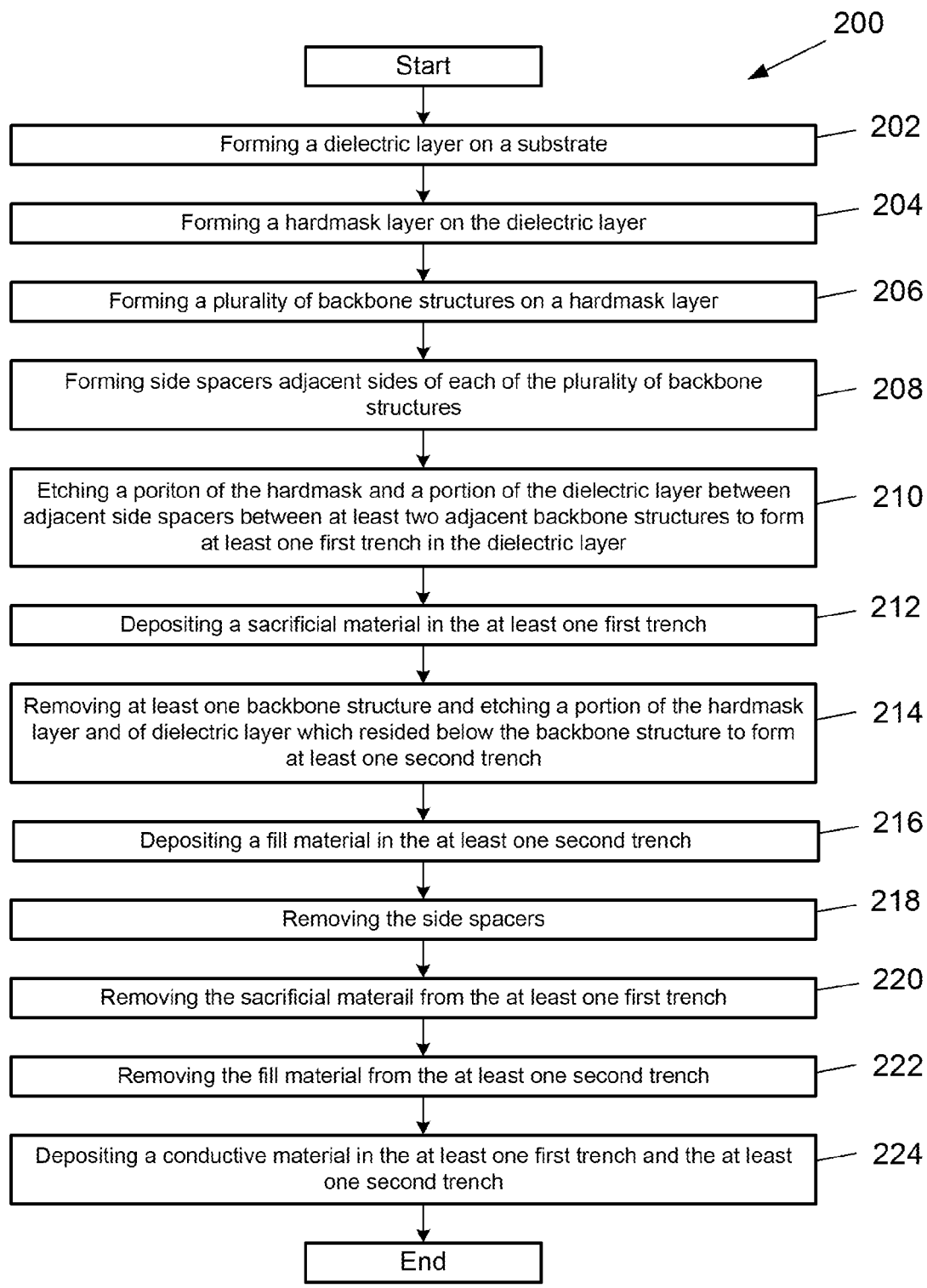
FIG. 29 is a flow chart of a process of fabricating an interconnection layer, according to an embodiment of the present description.

FIG. 29 is a flow chart of a process 200 of fabricating a microelectronic structure according to an embodiment of the present description. As set forth in block 202, a dielectric layer may be formed on a substrate. A hardmask layer may be formed on the dielectric layer, as set forth in block 204. As set forth in block 206, a plurality of backbone structures may be formed on a hardmask layer. Side spacers may be formed adjacent sides of each of the plurality of backbone structures, as set forth in block 208. As set forth in block 210, a portion of the first hardmask and a portion of the dielectric layer may be etched between adjacent side spacers between at least two adjacent backbone structures to form at least one first trench in the dielectric layer. A sacrificial material may be deposited in the at least one first trench, as set forth in block 212. As set forth in block 214, at least one backbone structure may be removed and a portion of the hardmask layer and of dielectric layer which resided below the backbone structure may be etched to form at least one second trench. A fill material may be deposited in the at least one second trench, as set forth in block 216. As set forth in block 218, the side spacers may be removed. The sacrificial material may be removed from the at least one first trench, as set forth in block 220. As set forth in block 222, the fill material may be removed from the at least one second trench. A conductive material deposited in the at least one first trench and the at least one second trench, as set forth in block 224.

Figure 30:
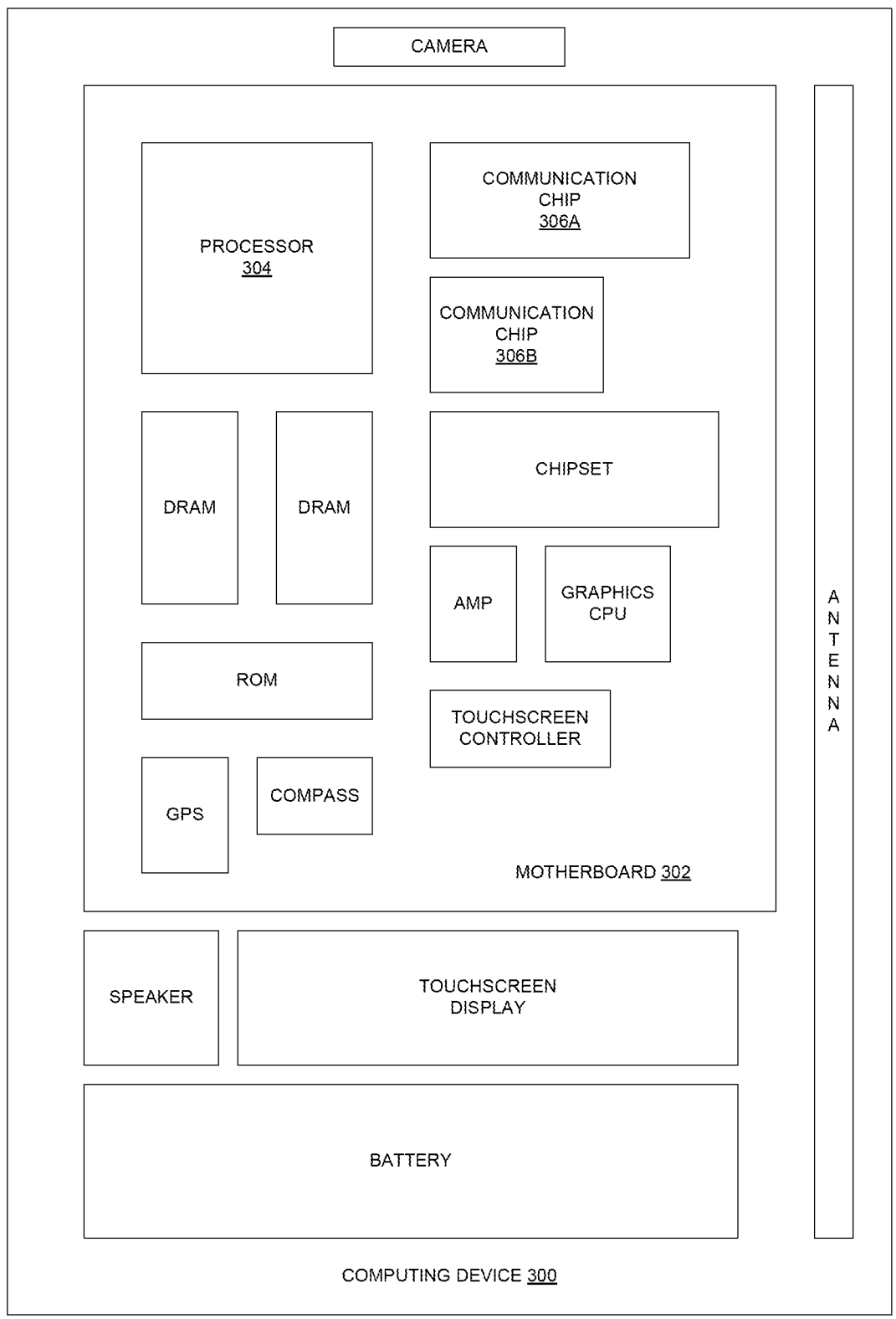
FIG. 30 illustrates a computing device in accordance with one implementation of the present description.

FIG. 30 illustrates a computing device 300 in accordance with one implementation of the present description. The computing device 300 houses a board 302. The board 302 may include a number of components, including but not limited to a processor 304 and at least one communication chip 306A, 306B. The processor 304 is physically and electrically coupled to the board 302. In some implementations the at least one communication chip 306A, 306B is also physically and electrically coupled to the board 302. In further implementations, the communication chip 306A, 306B is part of the processor 304.

Depending on its applications, the computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306A, 306B enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306A, 306B. For instance, a first communication chip 306A may be dedicated to shorter range wireless communications such as Wi-Fi and Bluetooth and a second communication chip 306B may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of the present description, the integrated circuit die of the processor may be connected to other devices with one or more interconnection layers that are formed in accordance with implementations described above. The term "processor" may refer to any device or portion of a device that processes electronic data from registers and/or memory to transform that electronic data into other electronic data that may be stored in registers and/or memory.

The communication chip 306A, 306B also includes an integrated circuit die packaged within the communication chip 306A, 306B. In accordance with another implementation of the present description, the integrated circuit die of the communication chip may be connected to other devices with one or more interconnection layers that are formed in accordance with implementations described above.

In further implementations, another component housed within the computing device 300 may contain an integrated circuit die that includes an interconnect in accordance with embodiments of the present description.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

It is understood that the subject matter of the present description is not necessarily limited to specific applications illustrated in FIGS. 1-30. The subject matter may be applied to other microelectronic devices and assembly applications, as well as any appropriate electronic application, as will be understood to those skilled in the art.

The following examples pertain to further embodiments. Specifics in the examples may be used anywhere in one or more embodiments.

In Example 1, a method of forming a microelectronic structure may comprise forming a dielectric layer on a substrate; forming a hardmask layer on the dielectric layer; forming a plurality of backbone structures on a hardmask layer; forming side spacers adjacent sides of each of the plurality of backbone structures; etching a portion of the first hardmask and a portion of the dielectric layer between adjacent side spacers between at least two adjacent backbone structures to form at least one first trench; depositing a sacrificial material in the at least one first trench; removing at least one backbone structure and etching a portion of the hardmask layer and the dielectric layer which resided below the at least one backbone structure to form at least one second trench; depositing a fill material in the at least one second trench; removing the side spacers; removing the sacrificial material from the at least one first trench; removing the fill material from the at least one second trench; and depositing a conductive material in the at least one first trench and the at least one second trench.

In Example 2, the subject matter of Example 1 can optionally include forming the plurality of backbone structures comprising depositing a backbone material on the first hardmask; patterning spacers adjacent the backbone material; and etching the backbone material to transfer the pattern of the spacers into the backbone material.

In Example 3, the subject matter of Example 2 can optionally include the patterning of the spacers adjacent the backbone material comprising patterning sacrificial hardmask structures adjacent the backbone material; depositing a conformal spacer material layer over the plurality of backbone structures; anisotropically etching the conformal spacer material layer; and removing the sacrificial hardmask structures.

In Example 4, the subject matter of any of Examples 1 to 3 can optionally include forming side spacers adjacent sides of each of the plurality of backbone structures comprising depositing a conformal side spacer material layer over the plurality of backbone structures; and anisotropically etching the conformal side spacer material layer.

In Example 5, the subject matter of any of Examples 1 to 4 can optionally include removing the side spacers comprising polishing away the side spacers.

In Example 6, the subject matter of any of Examples 1 to 5 can optionally include depositing the sacrificial material in the at least one second trench comprising depositing a material selected from the group consisting of titanium nitride, ruthenium, and cobalt.

In Example 7, the subject matter of any of Examples 1 to 6 can optionally include depositing the fill material in the at least one second trench comprising depositing a carbon hardmask in the at least one second trench.

In Example 8, the subject matter of any of Examples 1 to 7 can optionally include forming the dielectric layer on the substrate comprising forming a low k dielectric layer.

In Example 9, the subject matter of any of Examples 1 to 8 can optionally include forming the plurality of backbone structures on the hardmask layer comprising forming the plurality of backbone structures from a material selected from the group consisting of polysilicon, amorphous silicon, amorphous carbon, silicon nitride and germanium.

In Example 10, the subject matter of any of Examples 1 to 9 can optionally include depositing the conductive material in the at least one first trench and the at least one second trench comprising depositing a metal.

In Example 11, a method of forming a microelectronic structure may comprise forming a dielectric layer on a substrate, wherein the substrate includes a first contact structure and a second contact structure; forming a hardmask layer on the dielectric layer; forming a plurality of backbone structures on a hardmask layer; forming side spacers adjacent sides of each of the plurality of backbone structures; etching a portion of the first hardmask and a portion of the dielectric layer between adjacent side spacers between at least two adjacent backbone structures to form at least one first trench; forming a first via extending from the at least one first trench to the substrate first contact structure; depositing a sacrificial material in the at least one first trench; removing at least one backbone structure and etching a portion of the hardmask layer and the dielectric layer which resided below the at least one backbone structure to form at least one second trench; forming a second via extending from the at least one second trench to the substrate second contact structure; depositing a fill material in the at least one second trench; removing the side spacers; removing the sacrificial material from the at least one first trench; removing the fill material from the at least one second trench; and depositing a conductive material in the at least one first trench, the first via, the at least one second trench, and the second via.

In Example 12, the subject matter of Example 11 can optionally include forming the plurality of backbone structures comprising depositing a backbone material on the first hardmask; patterning spacers adjacent the backbone material; and etching the backbone material to transfer the pattern of the spacers into the backbone material.

In Example 13, the subject matter of Example 12 can optionally include patterning the spacers adjacent the backbone material comprising patterning sacrificial hardmask structures adjacent the backbone material; depositing a conformal spacer material layer over the plurality of backbone structures; anisotropically etching the conformal spacer material layer; and removing the sacrificial hardmask structures.

In Example 14, the subject matter of any of Examples 11 to 13 can optionally include forming side spacers adjacent sides of each of the plurality of backbone structures comprising depositing a conformal side spacer material layer over the plurality of backbone structures; and anisotropically etching the conformal side spacer material layer.

In Example 15, the subject matter of any of Examples 11 to 14 can optionally include removing the side spacers comprising polishing away the side spacers.

In Example 16, the subject matter of any of Examples 11 to 15 can optionally include depositing the sacrificial material in the at least one second trench comprising depositing a material selected from the group consisting of titanium nitride, ruthenium, and cobalt.

In Example 17, the subject matter of any of Examples 11 to 16 can optionally include depositing the fill material in the at least one second trench comprising depositing a carbon hardmask in the at least one second trench.

In Example 18, the subject matter of any of Examples 11 to 17 can optionally include forming the dielectric layer on the substrate comprising forming a low k dielectric layer.

In Example 19, the subject matter of any of Examples 11 to 18 can optionally include forming the plurality of backbone structures on the hardmask layer comprising forming the plurality of backbone structures from a material selected from the group consisting of polysilicon, amorphous silicon, amorphous carbon, silicon nitride and germanium.

In Example 20, the subject matter of any of Examples 11 to 19 can optionally include depositing the conductive material in the at least one first trench and the at least one second trench comprising depositing a metal.

In Example 21, a method of forming a microelectronic structure may comprise forming a dielectric layer on a substrate, wherein the substrate includes a first contact structure and a second contact structure; forming a hardmask layer on the dielectric layer; forming a plurality of backbone structures on a hardmask layer; forming side spacers adjacent sides of each of the plurality of backbone structures; etching a portion of the first hardmask and a portion of the dielectric layer between adjacent side spacers between at least two adjacent backbone structures to form at least one first trench; forming a first via extending from the at least one first trench to the substrate first contact structure; depositing a via hardmask material into the first via; depositing a sacrificial material in the at least one first trench; removing at least one backbone structure and etching a portion of the hardmask layer and the dielectric layer which resided below the at least one backbone structure to form at least one second trench; forming a second via extending from the at least one second trench to the substrate second contact structure; depositing a fill material in the at least one second trench; removing the side spacers; removing the sacrificial material from the at least one first trench; removing the via hardmask material from the first via; removing the fill material from the at least one second trench; and depositing a conductive material in the at least one first trench, the first via, the at least one second trench, and the second via.

In Example 22, the subject matter of Example 21 can optionally include removing the via hardmask material from the first via and removing the fill material from the at least one second trench comprising simultaneously removing the via hardmask material from the first via and removing the fill material from the at least one second trench.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A method of forming a microelectronic structure, comprising:
- forming a dielectric layer on a substrate;
- forming a first hardmask layer on the dielectric layer;
- forming a plurality of backbone structures on the first hardmask layer;
- forming side spacers adjacent sides of each of the plurality of backbone structures;
- etching a portion of the first hardmask layer and a portion of the dielectric layer between adjacent side spacers between at least two adjacent backbone structures to form at least one first trench, without removing any of the plurality of backbone structures;
- depositing a sacrificial material in the at least one first trench;
- removing at least one backbone structure and etching a portion of the first hardmask layer and the dielectric layer which resided below the at least one backbone structure to form at least one second trench, without removing the sacrificial material in the at least one first trench;
- depositing a fill material in the at least one second trench;
- removing the side spacers;
- removing the sacrificial material from the at least one first trench;
- removing the fill material from the at least one second trench; and
- depositing a conductive material in the at least one first trench and the at least one second trench.

2. The method of claim 1, wherein forming the plurality of backbone structures comprises:
- depositing a backbone material on the first hardmask;
- patterning spacers adjacent the backbone material; and
- etching the backbone material to transfer the pattern of the spacers into the backbone material.

3. The method of claim 2, wherein patterning spacers adjacent the backbone material comprises:
- patterning sacrificial hardmask structures adjacent the backbone material;
- depositing a conformal spacer material layer over the plurality of backbone structures;
- anisotropically etching the conformal spacer material layer; and
- removing the sacrificial hardmask structures.

4. The method of claim 1, wherein forming side spacers adjacent sides of each of the plurality of backbone structures comprises:
- depositing a conformal side spacer material layer over the plurality of backbone structures; and
- anisotropically etching the conformal side spacer material layer.

5. The method of claim 1, wherein removing the side spacers comprises polishing away the side spacers.

6. The method of claim 1, wherein depositing the sacrificial material in the at least one first trench comprises depositing a material selected from the group consisting of titanium nitride, titanium oxide, ruthenium, and cobalt.

7. The method of claim 1, wherein depositing the fill material in the at least one second trench comprises depositing a carbon hardmask in the at least one second trench.

8. The method of claim 1, wherein forming the dielectric layer on the substrate comprises forming a low k dielectric layer.

9. The method of claim 1, wherein forming the plurality of backbone structures on the first hardmask layer comprises forming the plurality of backbone structures from a material selected from the group consisting of polysilicon, amorphous silicon, amorphous carbon, silicon carbide, silicon nitride and germanium.

10. The method of claim 1, wherein depositing the conductive material in the at least one first trench and the at least one second trench comprises depositing a metal.

11. A method of forming a microelectronic structure, comprising:
- forming a dielectric layer on a substrate, wherein the substrate includes a first contact structure and a second contact structure;
- forming a first hardmask layer on the dielectric layer;
- forming a plurality of backbone structures on the first hardmask layer;
- forming side spacers adjacent sides of each of the plurality of backbone structures;
- etching a portion of the first hardmask layer and a portion of the dielectric layer between adjacent side spacers between at least two adjacent backbone structures to form at least one first trench, without removing any of the plurality of backbone structures;
- forming a first via extending from the at least one first trench to the substrate first contact structure;
- depositing a sacrificial material in the at least one first trench;
- removing at least one backbone structure and etching a portion of the first hardmask layer and the dielectric layer which resided below the at least one backbone structure to form at least one second trench, without removing the sacrificial material in the at least one first trench;
- forming a second via extending from the at least one second trench to the substrate second contact structure;
- depositing a fill material in the at least one second trench;
- removing the side spacers;
- removing the sacrificial material from the at least one first trench;
- removing the fill material from the at least one second trench; and
- depositing a conductive material in the at least one first trench, the first via, the at least one second trench, and the second via.

12. The method of claim 11, wherein forming the plurality of backbone structures comprises:
- depositing a backbone material on the first hardmask;
- patterning spacers adjacent the backbone material; and
- etching the backbone material to transfer the pattern of the spacers into the backbone material.

13. The method of claim 12, wherein patterning spacers adjacent the backbone material comprises:
- patterning sacrificial hardmask structures adjacent the backbone material;
- depositing a conformal spacer material layer over the plurality of backbone structures;
- anisotropically etching the conformal spacer material layer; and
- removing the sacrificial hardmask structures.

14. The method of claim 11, wherein forming side spacers adjacent sides of each of the plurality of backbone structures comprises:
- depositing a conformal side spacer material layer over the plurality of backbone structures; and
- anisotropically etching the conformal side spacer material layer.

15. The method of claim 11, wherein removing the side spacers comprises polishing away the side spacers.

16. The method of claim 11, wherein depositing the sacrificial material in the at least one first trench comprises depositing a material selected from the group consisting of titanium nitride, titanium oxide, ruthenium, and cobalt.

17. The method of claim 11, wherein depositing the fill material in the at least one second trench comprises depositing a carbon hardmask in the at least one second trench.

18. The method of claim 11, wherein forming the dielectric layer on the substrate comprises forming a low k dielectric layer.

19. The method of claim 11, wherein forming the plurality of backbone structures on the first hardmask layer comprises forming the plurality of backbone structures from a material selected from the group consisting of polysilicon, amorphous silicon, amorphous carbon, silicon carbide, silicon nitride and germanium.

20. The method of claim 11, wherein depositing the conductive material in the at least one first trench and the at least one second trench comprises depositing a metal.

21. A method of forming a microelectronic structure, comprising:
   forming a dielectric layer on a substrate, wherein the substrate includes a first contact structure and a second contact structure;
   forming a hardmask layer on the dielectric layer;
   forming a plurality of backbone structures on a hardmask layer;
   forming side spacers adjacent sides of each of the plurality of backbone structures;
   etching a portion of the hardmask layer and a portion of the dielectric layer between adjacent side spacers between at least two adjacent backbone structures to form at least one first trench, without removing any of the plurality of backbone structures;
   forming a first via extending from the at least one first trench to the substrate first contact structure;
   depositing a via hardmask material into the first via;
   depositing a sacrificial material in the at least one first trench;
   removing at least one backbone structure and etching a portion of the hardmask layer and the dielectric layer which resided below the at least one backbone structure to form at least one second trench, without removing the sacrificial material in the at least one first trench;
   forming a second via extending from the at least one second trench to the substrate second contact structure;
   depositing a fill material in the at least one second trench;
   removing the side spacers;
   removing the sacrificial material from the at least one first trench;
   removing the via hardmask material from the first via;
   removing the fill material from the at least one second trench; and
   depositing a conductive material in the at least one first trench, the first via, the at least one second trench, and the second via.

22. The method of claim 21, wherein removing the via hardmask material from the first via and removing the fill material from the at least one second trench comprises simultaneously removing the via hardmask material from the first via and removing the fill material from the at least one second trench.

* * * * *